(12) United States Patent
Jung (10) Patent No.: US 7,679,126 B2
(45) Date of Patent: *Mar. 16, 2010

(54) SPLIT GATE TYPE NON-VOLATILE MEMORY DEVICE AND METHOD OF MANUFACTURING THE SAME

(75) Inventor: Jin Hyo Jung, Bucheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 15 days.

This patent is subject to a terminal disclaimer.

(21) Appl. No.: 11/516,098

(22) Filed: Sep. 5, 2006

(65) Prior Publication Data

US 2007/0052007 A1 Mar. 8, 2007

(30) Foreign Application Priority Data

Sep. 5, 2005 (KR) ........................ 10-2005-0082233

(51) Int. Cl.
*H01L 29/788* (2006.01)
(52) U.S. Cl. ................ 257/314; 257/315; 257/E21.179; 257/E21.679; 438/257; 438/263; 438/266; 438/267
(58) Field of Classification Search .......... 257/E21.179, 257/315, 314, E21.679; 438/257, 263, 266, 438/267
See application file for complete search history.

(56) References Cited

U.S. PATENT DOCUMENTS 6,525,369 B1 * 2/2003 Wu .............................. 257/315

| 6,620,687 | B2 | | 9/2003 | Tseng |
| 6,740,557 | B1 | | 5/2004 | Lin |
| 7,169,672 | B1 | * | 1/2007 | Jung ........................... 438/266 |
| 2002/0127804 | A1 | * | 9/2002 | Tseng ......................... 438/264 |
| 2003/0146465 | A1 | * | 8/2003 | Wu ............................. 257/314 |
| 2003/0214864 | A1 | * | 11/2003 | Lee et al. ..................... 365/200 |
| 2004/0214395 | A1 | * | 10/2004 | Wang .......................... 438/257 |
| 2005/0142761 | A1 | | 6/2005 | Jung |
| 2005/0184332 | A1 | * | 8/2005 | Hirooka et al. ............. 257/315 |
| 2005/0208744 | A1 | * | 9/2005 | Jeon et al. ................... 438/593 |

OTHER PUBLICATIONS

Brown et al., Nonvolatile Semiconductor Memory Technology, IEEE Press, 1998, pp. 336-337, 393-394.*
English Translation of Office Action dated Jan. 18, 2008, for German Application No. 10 2006 041 546.9-33 filed on Sep. 5, 2006; German Patent and Trademark Office, Germany.

* cited by examiner

*Primary Examiner*—Eugene Lee
*Assistant Examiner*—Peniel M Gumedzoe
(74) *Attorney, Agent, or Firm*—The Law Offices of Andrew D. Fortney; Andrew D. Fortney (57) ABSTRACT

A non-volatile memory device (e.g., a split gate type device) and a method of manufacturing the same are disclosed. The memory device includes an active region on a semiconductor substrate, a pair of floating gates above the active region, a charge storage insulation layer between each floating gate and the active region, a pair of wordlines over the active region and partially overlapping the floating gates, respectively, and a gate insulation film between each wordline and the active region. The method may prevent or reduce the incidence of conductive stringers on the active region between the floating gates, to thereby improve reliability of the memory devices and avoid the active region resistance from being increased due to the stringer.

19 Claims, 7 Drawing Sheets

SPLIT GATE TYPE NON-VOLATILE MEMORY DEVICE AND METHOD OF MANUFACTURING THE SAME

BACKGROUND OF THE INVENTION

1. Field of the Invention

The present invention relates to a semiconductor device and a method of manufacturing the same, and more specifically to a (split gate type) non-volatile memory device and a method of manufacturing the same.

2. Background of the Related Art

Since some non-volatile memory devices are electrically erasable and programmable and do not require power to retain the programmed data, the scope of their application is being widened increasingly in various fields. Some such non-volatile memory devices (such as flash memory) can be categorized typically into a NAND type and a NOR type. The NAND and NOR memory cells have advantages of high-density integration and high-speed operation, respectively. The NAND or NOR memory devices tend to expand their applications to the fields where the respective advantages are of importance.

In the NOR type non-volatile memory device, a plurality of memory cells is arranged in parallel to a single bit line. Each memory cell is composed of a single transistor. The NOR type non-volatile memory is configured such that a single memory cell transistor is connected between a drain connected to a bit line and a source connected to a common source line. The NOR type memory has an advantage of having a high memory cell current and being capable of being operated at a high speed. However, one drawback thereto is that the bit line contact and the source line occupy a larger relative area of the device, which can present challenges for high-density integration.

A NOR type non-volatile memory device may be configured such that its memory cells are connected in parallel to a bit line. Thus, if a threshold voltage of the memory cell transistor is lower than a voltage (commonly 0V) applied to the wordline of an unselected memory cell, current may flow between the source and the drain regardless of 'on' or 'off' state of a selected memory cell. In such a case, the device may malfunction (i.e., the memory cell may be read as having an 'on' state). In order to solve this problem, a non-volatile memory device having a split gate architecture (or split gate type) has been proposed.

A non-volatile memory device such as a flash memory device may have a layered configuration such as a FLOTOX structure or a SONOS structure, having a multi-layered gate insulation film and a structure similar to a MOS transistor. In the case of SONOS devices, the gate insulation film comprises a multi-layered charge storage insulation layer, and charge is stored in a deep level (or oxide-nitride interface) trap. In some cases, the SONOS structure may provide better reliability, as compared with a flash memory device, and enable program and erase operations at a lower voltage.

Figure 1:
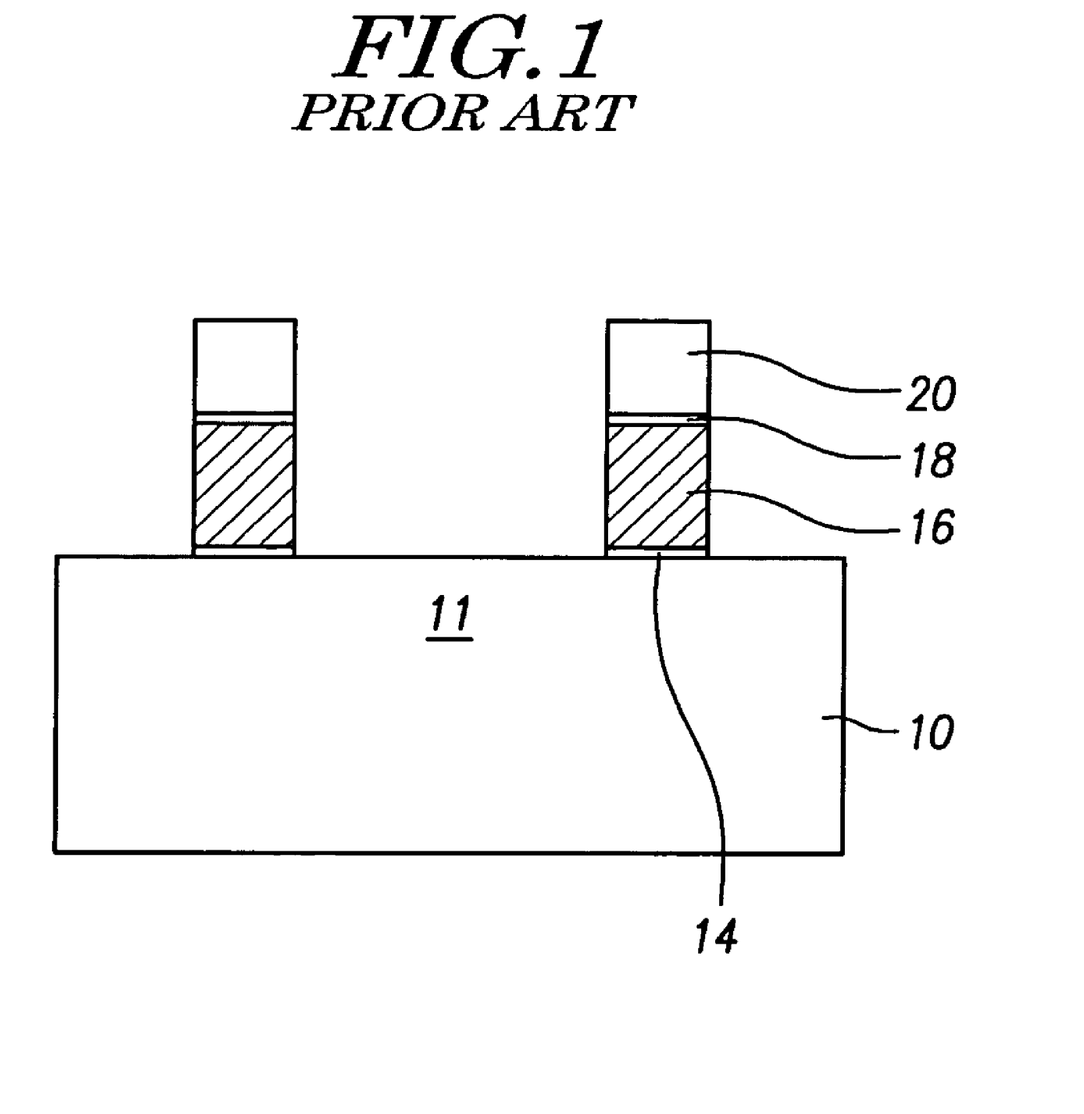
FIGS. 1 to 3 show a conventional method of manufacturing a split gate type non-volatile memory device.
Figure 2:
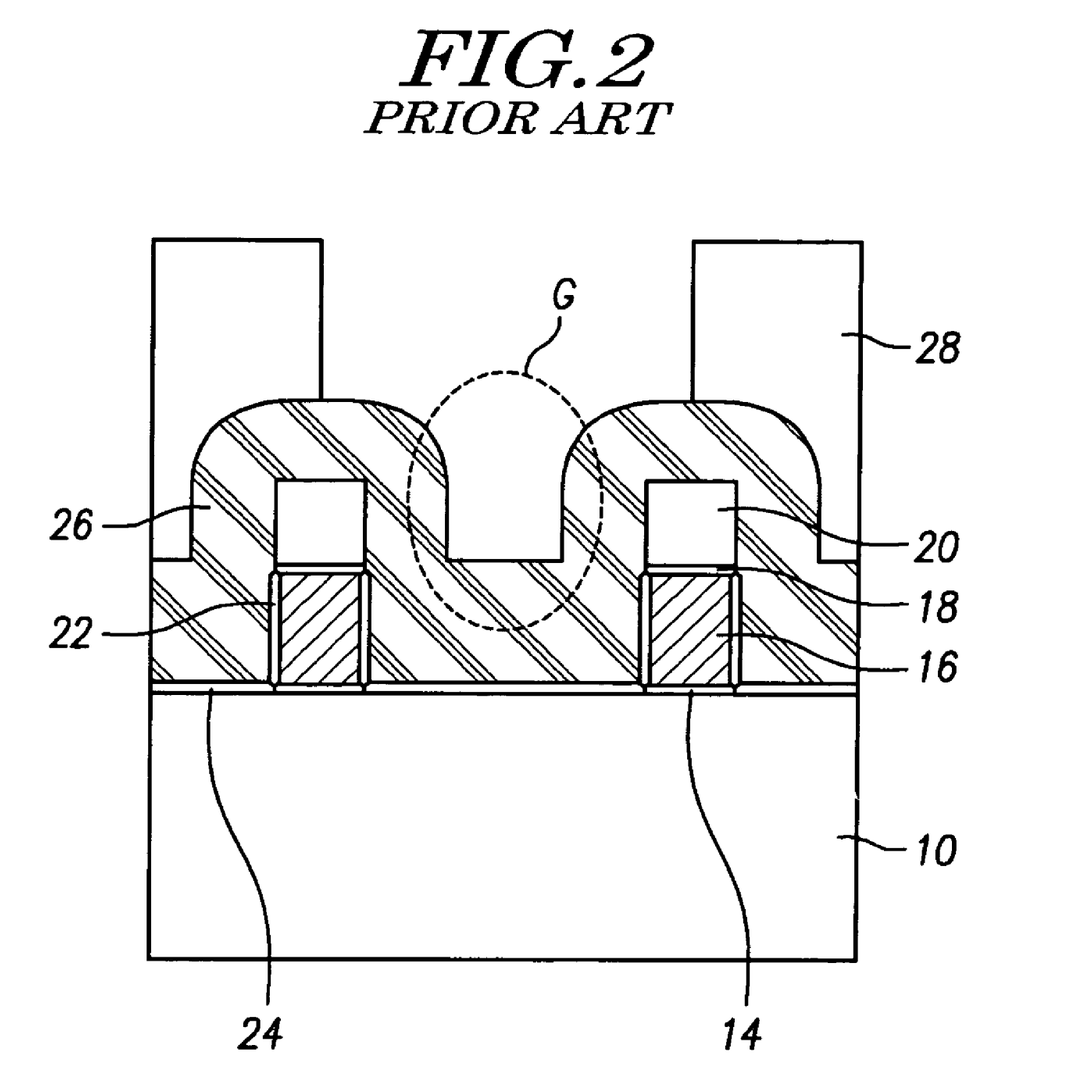
Figure 3:
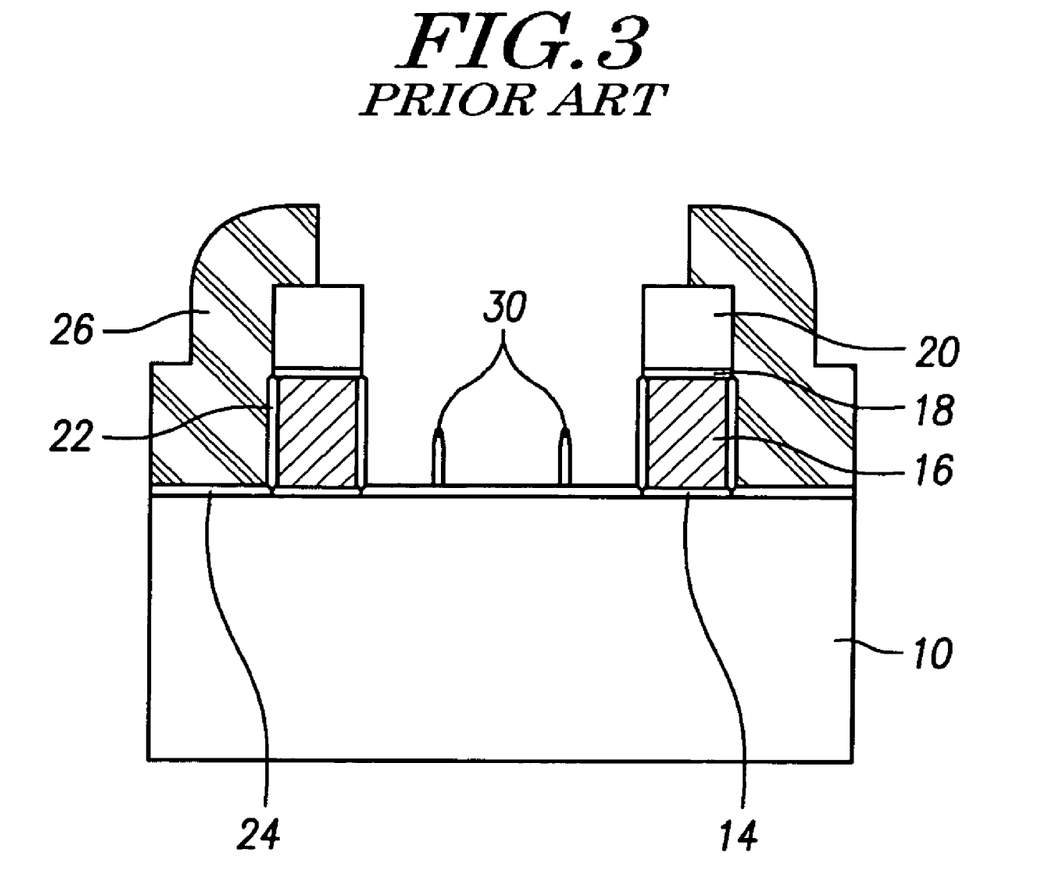

A conventional method of manufacturing a split gate type non-volatile memory device is shown in FIGS. 1 to 3.

Referring to FIG. 1, a device isolation film (not shown) is formed in or on a semiconductor substrate 10 to define an active region 11, and then a charge storage layer, a first conductive film and a capping film are formed. In case of a SONOS device where an insulation film having a high trap density is between a tunnel insulation film and a blocking insulation film to form the charge storage layer, in general, a layered silicon oxide film-silicon nitride film-silicon oxide film (ONO film) structure is employed. Further, in the case of a FLOTOX device, which has a layered gate structure including a floating gate, the charge storage layer may be composed of a tunnel oxide film, a polysilicon floating gate and an ONO film. In addition, a buffer layer of silicon oxide and a hard mask layer of silicon nitride may be laminated to form the capping film.

The capping film, first conductive film and charge storage layer are patterned in sequence to form a first conductive film pattern 16 on the active region with a multi-layered charge storage layer 14 interposed in-between, and a capping film pattern where an oxide film pattern 18 and a nitride film pattern 20 are laminated on the first conductive film pattern 16.

Referring to FIG. 2, a lateral insulation film 22 is formed on the side wall of the first conductive film pattern 16, and a gate insulation film 24 is formed on the active region. A second conductive film 26 is formed on the gate insulation film 24 in a conformal manner. At this time, the second conductive film 26 forms a groove G between the first conductive patterns 16 such that it has a side wall. In addition, a photoresist pattern 28 is formed on the second conductive film 26.

As shown in FIG. 3, using the photoresist pattern 28 as an etching mask, the second conductive film 26 is patterned such that the active region between neighboring first conductive patterns 16 can be exposed. The second conductive film 26 is removed through an anisotropic etching process. When the anisotropic etching is being carried out, often polymers or other by-products form (e.g., are stacked) on the side wall portion of the second conductive film 26 between the neighboring first conductive patterns 16 (see FIG. 2) to thereby inhibit the etching process from being smoothly performed. As the result, when the gate insulation film 24 is exposed through etching of the second conductive film 26, a conductive stringer 30 may be formed on the substrate 10. If the over-etching time is extended to completely remove the conductive stringer 30, the substrate 10 may be damaged. In the case where the conductive stringer 30 remains on the substrate, formation of silicide on the surface of the substrate 10 is inhibited, thereby increasing the resistance of the active region 11. Also, the conductive stringer 30 may act as a barrier to formation of a contact pattern, which may increase the contact resistance. Furthermore, the conductive stringers 30 may act as a particle source in subsequent processes.

SUMMARY OF THE INVENTION

Therefore, the present invention has been made in view of the above problems, and it is an object of the present invention to provide a split gate type non-volatile memory device and a method of manufacturing the same, in which a conductive stringer does not occur between first conductive patterns.

To accomplish the above object, according to one aspect of the present invention, there is provided a non-volatile memory device (which may be a split gate type non-volatile memory device). The split gate type memory device includes an active region in a semiconductor substrate, a pair of first conductive film patterns above the active region, a charge storage layer between the first conductive film patterns and the active region, a pair of wordlines on the active region and each partially overlapping with a corresponding first conductive film pattern, and a gate insulation film between the wordlines and the active region. A first sidewall of the respective conductive film patterns faces the other first sidewall. The wordline is continuous along the active region, adjacent to a second, opposite sidewall the first conductive pattern and the first sidewall and the top of the first conductive pattern. The opposing sidewalls of the first conductive film patterns are self-aligned with corresponding first sidewalls of the respective wordlines.

According to another aspect of the invention, there is also provided a method of manufacturing a (split gate type) non-volatile memory device. In the method of the invention, an active region may be defined in the semiconductor substrate. A multi-layered charge storage layer and a first conductive film pattern are formed on the active region. A second conductive film is formed conformally over the whole first conductive film pattern. The second conductive film may be patterned to form an opening above the first conductive film pattern, e.g., so as to transverse the active region. Using a photoresist pattern as an etching mask, the second conductive film and the first conductive film pattern are etched simultaneously (e.g., in situ) or sequentially to form a pair of first conductive film patterns.

DETAILED DESCRIPTION OF THE PREFERRED EMBODIMENT

Embodiments of the invention will be hereafter described in detail, with reference to the accompanying drawings.

Figure 4:
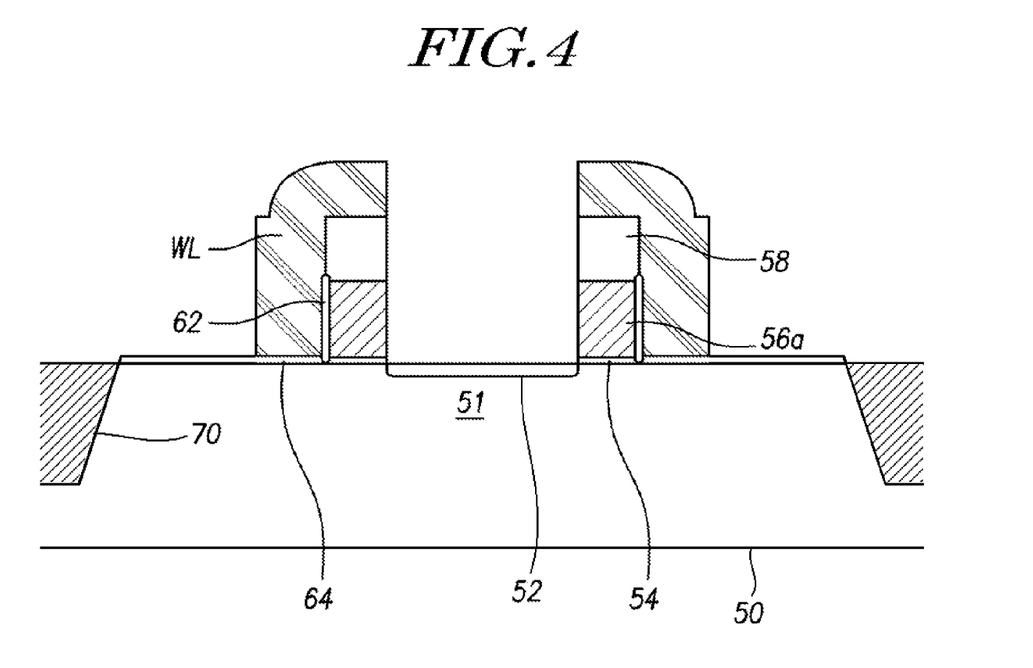
FIG. 4 is a sectional view of a split gate type non-volatile memory device according to an embodiment of the invention.

FIG. 4 is a sectional view illustrating a split gate type non-volatile memory device according to an embodiment of the invention.

Referring to FIG. 4, a pair of adjacent first conductive film patterns 56a are on an active region 51 defined by a device isolation film (e.g., two or more shallow trench isolation and/or LOCOS field oxide structures 70 in a semiconductor substrate 50. One sidewall (e.g., a first sidewall) of each first conductive film pattern 56a faces the corresponding first sidewall of the other first conductive film pattern 56a, and a wordline WL is formed on a portion of the active region 51 adjacent to another side wall thereof (e.g., a second sidewall on a surface of first conductive film pattern 56a opposite to the first sidewall). A multi-layered charge storage layer 54 is between each of the first conductive patterns 56a and the active region 51. A gate insulation film 64 is between the wordline WL and the active region 51. In case of a SONOS device, the multi-layered charge storage layer 54 may comprise an ONO layer (e.g., having a silicon oxide film-silicon nitride film-silicon oxide film stack or structure). In case of a stacked-gate type device (e.g., a FLOTOX cell), it may comprise a tunnel insulation film-floating gate-insulation film (e.g., an ONO layer) stack or structure. The invention will be explained mainly with reference to a SONOS device. It is however appreciated by those skilled in the art that the features of the invention can be applied to other stacked-gate type devices.

In addition, a capping insulation film pattern 57 is formed on the pair of first conductive film patterns 56a, and a lateral insulation film 62 is on the sidewall of the first conductive film pattern 56a facing the wordline WL, thereby electrically insulating the first conductive film patterns 56a and the wordline WL from each other. The wordline WL is disposed so as to cross the top portion of the active region 51. The wordline WL is formed continuously on that portion of the active region 51 adjacent to the first conductive film patterns 56a and on the side wall and top surface of the first conductive film patterns 56a (i.e., the top surface of the capping insulation film pattern 57) such that part of the wordline WL overlaps the first conductive film patterns 56a. The end portions of the wordlines overlapping the first conductive film pattern 56a (i.e., the first sidewalls of the wordlines above the first conductive film patterns 56a) are aligned with the first sidewalls of the first conductive film patterns 56a. Thus, the opposing (first) sidewalls of the pair of neighboring first conductive film patterns 56a are self-aligned with the corresponding first sidewalls of the wordlines WL formed above the first conductive film patterns. The neighboring wordlines WL are symmetrically disposed above the pair of first conductive film patterns 56a and transverse upper portion of the active region 51.

Figure 5:
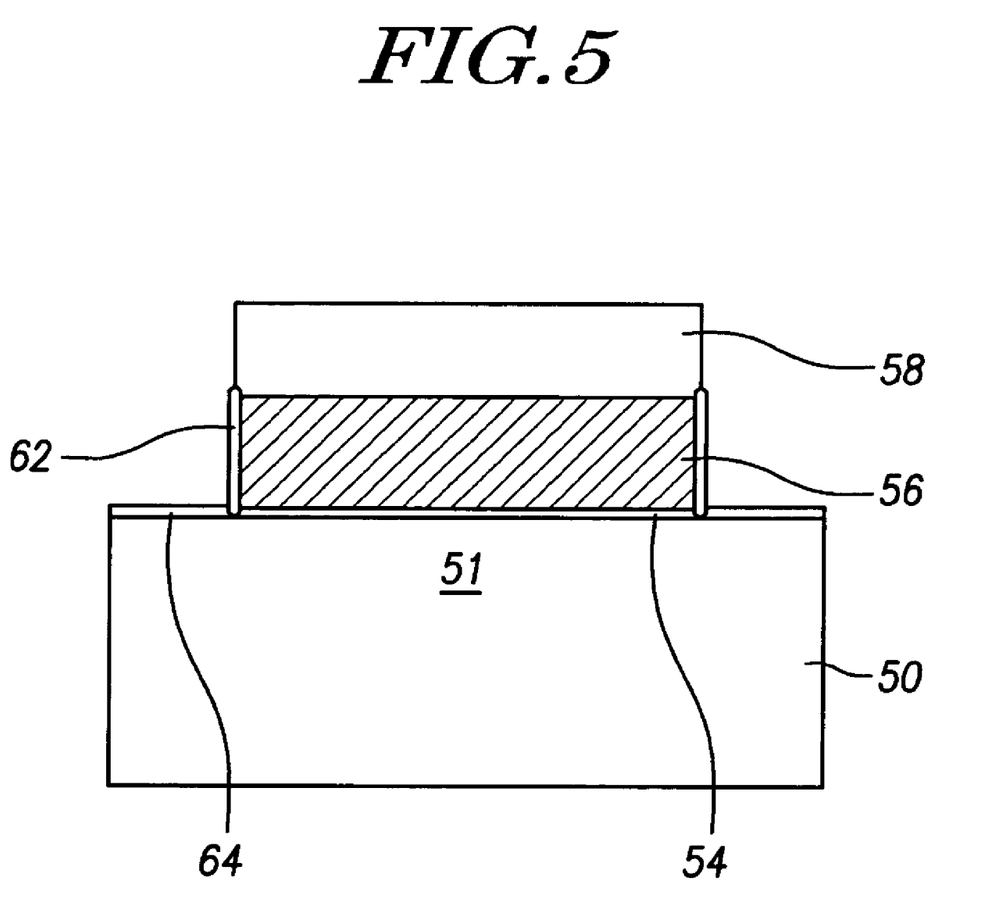
FIGS. 5 to 7 are sectional views explaining a method of manufacturing a split gate type non-volatile memory device according to an embodiment of the invention.
Figure 6:
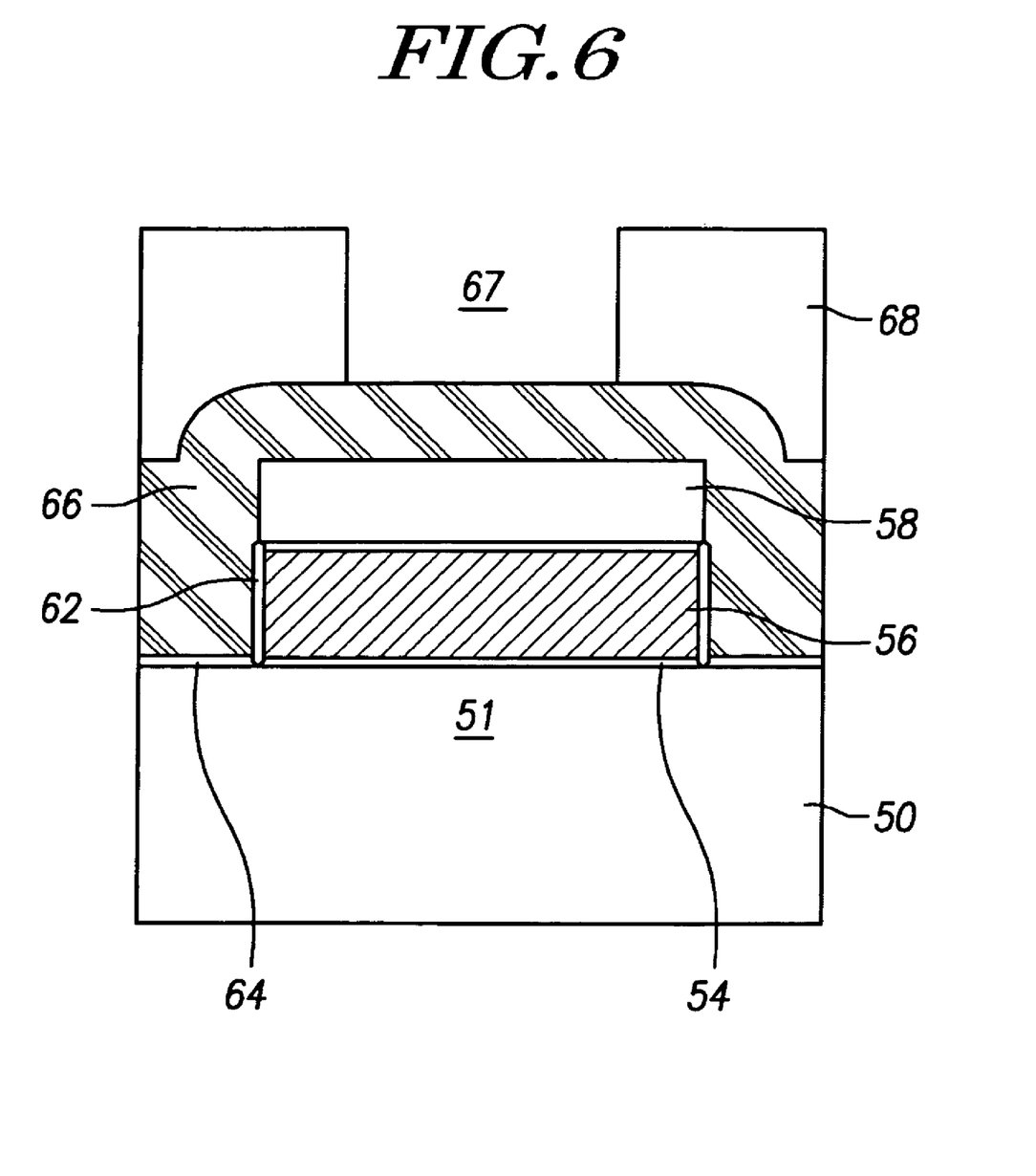
Figure 7:
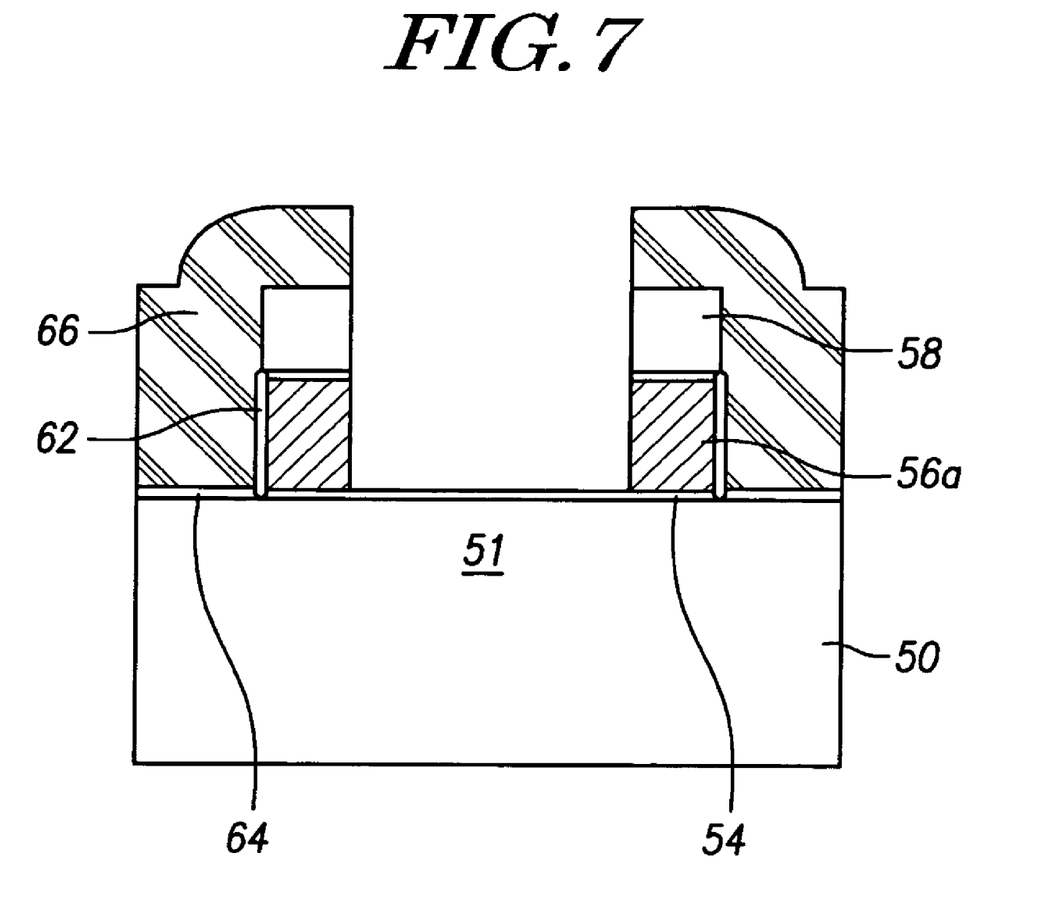

FIGS. 5 to 7 explain a method of manufacturing a split gate type non-volatile memory device according to an embodiment of the invention.

Referring to FIG. 5, a device isolation film is formed on and/or in a semiconductor substrate in a predetermined pattern (not shown) to thereby define an active region 51. Then, a multi-layered charge storage layer, a first conductive film and a capping layer are formed. The first conductive film generally comprises polysilicon, which may be conventionally (and optionally heavily) doped. Until this step, a conventional process for fabricating a split gate type non-volatile memory device may be used. The capping layer and the first conductive film are patterned in sequence to form a first conductive film pattern 56 and a capping layer pattern 58 laminated on the active region 51. The width of first conductive film pattern 56 and capping layer pattern 58 are significantly greater than conventional widths for such structures in nonvolatile memory cells; for example, in a 0.18 µm manufacturing process, the width of first conductive film pattern 56 and capping layer pattern 58 may be from 0.5 to 1.0 µm. Thus, it is not necessary to use advanced photolithography equipment (e.g., having a capability to pattern layers of material at or near a minimum or critical dimension of a given manufacturing process to pattern first conductive film pattern 56 and capping layer pattern 58. In order to cure or repair a sidewall that may have been damaged during formation of the first conductive film pattern (e.g., during an etching process), a sidewall insulation film 62 is formed by performing an oxidation process on the sidewall of the first conductive film pattern 56. For example, sidewall insulation film 62 may be formed by thermally oxidizing the first conductive film pattern 56. Thereafter, the exposed multi-layered charge storage layer on the active region is removed, except for the multi-layered charge storage layer 54 underneath the first conductive film pattern 56, then a gate insulation film 64 is formed on the exposed active region.

Referring to FIG. 6, a second conductive film 66 is formed on the gate insulation film 64 in a conformal way. The second conductive film 66 may also comprise polysilicon, which may also be conventionally (and optionally heavily) doped with the same or different dopant, dopant type and/or dopant dose as the first conductive film pattern 56. A photoresist pattern 68 having an opening 67 is formed on the second conductive film. The opening 67 is disposed so as to traverse upper portion of the active region including the first conductive pattern 56 such that the second conductive film 66 is exposed inside the opening 67.

Similar to the first conductive film pattern 56, the width of the opening 67 is generally greater than a minimum or critical dimension of a given process or technology for manufacturing such nonvolatile memory cells; for example, in a 0.18 µm manufacturing process, the width of opening 67 may be from 0.2 to 0.7 µm. Thus, it may not be necessary to use advanced photolithography equipment (e.g., having a capability to pattern layers of material at or near the minimum line width or critical dimension) to form opening 67 in photoresist pattern 68.

Referring to FIG. 7, using the photoresist pattern 68 as an etching mask, the second conductive film 66 is etched, and simultaneously (e.g., in situ) or sequentially, the capping film pattern 58 and the first conductive pattern 56 are etched so as to be self-aligned with the second conductive film 66. Thus, a pair of first conductive patterns 56a is formed, the sidewalls of which face each other.

It will also be apparent to those skilled in the art that the invention may also provide a technique for forming conductive layers (e.g., select gates) and charge storage layers having widths less than a critical dimension of the manufacturing process used to make the device. For example, in a 0.18 μm manufacturing process, the width of first conductive patterns 56a may be from 0.10 to 0.15 μm, depending on the widths of first conductive pattern 56 (FIG. 5) and opening 67 in photoresist pattern 68 (FIG. 6).

Then, a common or conventional process for manufacturing a split gate type non-volatile memory device may be employed to pattern the other side of the second conductive film 66 and resultantly form a pair of symmetrical wordlines WL, as shown in FIG. 4. Alternatively, both sides of second conductive film 66 may be patterned using photoresist pattern 68 as an etching mask to form symmetrical wordlines WL.

As described above, and as shown in FIG. 4, according to the invention, a pair of wordline/gate stacks WL in a nonvolatile memory sharing a source/drain terminal 52 (e.g., the split gate type memory device described herein) may be formed after depositing a second conductive layer 66, thereby preventing a conductive stringer from forming or remaining in the active region. As the result, an increase in resistance by the conductive stringer can be avoided. Formation of particles can be reduced or prevented in subsequent processes. It is not necessary to lower the height of the first conductive film or extend over-etching time in order to remove the stringers, thereby enabling formation of a reliable device.

Although the present invention has been described with reference to certain embodiments, the description is illustrative of the invention and not to be construed as limiting the invention. Various modifications and variations may occur to those skilled in the art, without departing from the scope and spirit of the invention as defined by the appended claims.

What is claimed is:

1. A method of manufacturing a non-volatile memory device, comprising:
    sequentially forming a charge storage layer and a first conductive film on an active region of the non-volatile memory device, wherein the charge storage layer comprises an ONO layer;
    patterning the first conductive film to form a first conductive film pattern;
    removing a first exposed portion of the charge storage layer;
    forming a conformal second conductive film over the whole first conductive film pattern;
    forming a photoresist pattern on the second conductive film, the photoresist pattern having an opening over the active region;
    etching the second conductive film and the first conductive film pattern in the opening using the photoresist pattern as an etching mask to thereby form a pair of control gates from the first conductive film pattern;
    removing a second exposed portion of the charge storage layer in the opening such that the charge storage layer and the first conductive film pattern are substantially co-extensive; and
    forming a pair of wordlines by patterning the second conductive film such that the wordlines are over an uppermost surface of the first conductive film pattern and horizontally adjacent to a sidewall of the first conductive film pattern.

2. The method as defined in claim 1, further comprising the step of forming a capping insulation film pattern on the first conductive film pattern, wherein the capping insulation film pattern is etched in situ or sequentially after etching the second conductive film.

3. The method as defined in claim 1, before the step of forming the second conductive film, further comprising the steps of:
    forming a lateral insulation film on a sidewall of the first conductive film pattern; and
    forming a gate insulation film on the exposed active region.

4. The method as defined in claim 1, wherein first sidewalls of the respective control gates face each other on the active region, and end portions of the respective wordlines are aligned with the first sidewalls of the control gates.

5. The method as defined in claim 1, wherein the non-volatile memory device comprises a split gate type non-volatile memory device.

6. The method as defined in claim 5, further comprising defining the active region in a semiconductor substrate.

7. The method as defined in claim 1, wherein the active region consists essentially of a region in a semiconductor substrate between adjacent isolation structures.

8. The method as defined in claim 7, further comprising forming the adjacent isolation structures.

9. The method as defined in claim 1, wherein the opening is over a shared source/drain terminal in the active region.

10. The method as defined in claim 3, wherein forming the lateral insulation film comprises performing an oxidation process on the sidewall of the first conductive film pattern.

11. The method as defined in claim 3, wherein forming the lateral insulation film comprises thermally oxidizing the first conductive film pattern.

12. The method as defined in claim 1, wherein an opening between the pair of control gates has a width between 0.2 and 0.7 μm.

13. The method as defined in claim 12, wherein each of the pair of control gates has a width between 0.10 and 0.15 μm.

14. The method as defined in claim 1, wherein an opening between the pair of control gates has a width greater than a critical dimension of the manufacturing process used to make the device.

15. The method as defined in claim 14, wherein each of the pair of control gates has a width less than a critical dimension of the manufacturing process used to make the device.

16. The method as defined in claim 1, wherein the first conductive film pattern has a width between 0.5 and 1.0 μm.

17. The method as defined in claim 2, wherein the first conductive film pattern and capping insulation film pattern has a width between 0.5 and 1.0 μm.

18. The method as defined in claim 1, wherein the first conductive film pattern has a width greater than a critical dimension of the manufacturing process used to make the device.

19. The method as defined in claim 2, wherein the first conductive film pattern and capping insulation film pattern has a width greater than a critical dimension of the manufacturing process used to make the device.

* * * * *